(12) United States Patent
Kotake

(10) Patent No.: US 7,310,457 B2
(45) Date of Patent: Dec. 18, 2007

(54) MULTI-CHIP MODULE AND METHOD FOR MOUNTING THEREOF

(75) Inventor: Naoshi Kotake, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 11/197,591

(22) Filed: Aug. 5, 2005

(65) Prior Publication Data

US 2006/0188201 A1    Aug. 24, 2006

(30) Foreign Application Priority Data

Feb. 23, 2005    (JP)    ............................. 2005-046851

(51) Int. Cl.
  *G02B 6/12*    (2006.01)
(52) U.S. Cl. ...................................... 385/14
(58) Field of Classification Search .............. 385/14
  See application file for complete search history.

(56) References Cited

U.S. PATENT DOCUMENTS

| | | | | |
|---|---|---|---|---|
| 5,910,706 | A * | 6/1999 | Stevens et al. ............. | 313/498 |
| 6,257,771 | B1 * | 7/2001 | Okayasu ...................... | 385/89 |
| 6,285,808 | B1 * | 9/2001 | Mehlhorn et al. ........... | 385/14 |
| 6,370,292 | B1 * | 4/2002 | Strake ......................... | 385/14 |
| 6,829,398 | B2 * | 12/2004 | Ouchi ......................... | 385/14 |
| 6,987,906 | B2 * | 1/2006 | Nakama et al. .............. | 385/31 |
| 7,076,125 | B2 * | 7/2006 | Kouta et al. .................. | 385/14 |
| 7,242,822 | B2 * | 7/2007 | Yamada et al. ............... | 385/14 |
| 2004/0042705 | A1 * | 3/2004 | Uchida et al. ................ | 385/14 |
| 2004/0131302 | A1 * | 7/2004 | Kouta et al. .................. | 385/14 |
| 2004/0264838 | A1 * | 12/2004 | Uchida et al. ................ | 385/14 |

FOREIGN PATENT DOCUMENTS

| | | |
|---|---|---|
| JP | 7-183570 | 7/1995 |
| JP | 8-130292 | 5/1996 |
| JP | 10-321775 | 12/1998 |
| JP | 2000-39531 | 2/2000 |
| JP | 2000-47044 | 2/2000 |
| JP | 2001-36197 | 2/2001 |
| JP | 2002-98863 | 4/2002 |
| JP | 2002-270743 | 9/2002 |
| JP | 2002-343928 | 11/2002 |
| JP | 2002-365457 | 12/2002 |

* cited by examiner

*Primary Examiner*—Michelle R. Connelly-Cushwa
(74) *Attorney, Agent, or Firm*—Morgan, Lewis & Bockius LLP

(57) ABSTRACT

A multi-chip module having an optical element sending and receiving optical signals and mounted on a printed circuit board in which an optical guide is formed, includes an optical path-converting member that protrudes from a face of the multi-chip module that is to be connected to the printed circuit board, is optically connected to the optical element, and is inserted into an inserting hole formed on the printed circuit board so as to intersect the optical guide when mounting the multi-chip module. The optical path-converting member is inserted into the inserting hole to form an optical path guiding light from the optical element into the optical guide or guiding light transmitted through the optical guide into the optical element.

12 Claims, 8 Drawing Sheets

MULTI-CHIP MODULE AND METHOD FOR MOUNTING THEREOF

CROSS-REFERENCE TO RELATED APPLICATION

This application claims priority under USC 119 from Japanese Patent Application No. 2005-046851, the disclosure of which is incorporated by reference herein.

BACKGROUND OF THE INVENTION

1. Field of the Invention

The present invention relates to a multi-chip module and a method for mounting thereof, particularly, a multi-chip module that can be easily positioned on a printed circuit board and a method for mounting using the multi-chip module.

2. Description of the Related Art

Recently, in an electronic device such as a micro computer, it has been considered to improving operating speed and degree of integration by replacing electric distribution with optical distribution. Further, conventional electric telecommunication systems have been widely replaced with optical inter-connections that make it possible to communicate mass data at high speeds.

As an example of the above optical distribution system, it has been proposed to mount an optical multi-chip module (optical MCM, herein after) with an optical element carried thereon on a printed circuit board (Publication of unexamined patent application Nos. 1995-183570, 2000-47044, 2002-98863, 2002-365457, 2000-39531, and 2001-36197).

A multi-chip module (MCM), as well as an optical MCM, generates a large amount of heat and thus, needs to be efficiently cooled so as to operate the MCM appropriately. Additionally, after a long time usage, thermal damage is accumulated in the MCM and accordingly, it is difficult to extend the lifetime thereof.

Therefore, as a solution of the above problem, following methods are proposed:

layering a semi-conductor integrated circuit package and a heat-radiating plate alternately (Publication of unexamined patent application No. 1996-130292), cooling a MCM by disposing a heat-conducting sheet, a heat-radiating metal plate (Publication of unexamined patent application No. 1998-321775), or a through hole (Publication of unexamined patent application No. 2002-270743), and cooling a MCM by contacting with a heat sink disposed on a printed circuit board (Publication of unexamined patent application No. 2002-343928) are proposed.

However, in a conventional optical distribution system, mirrors, which reflect the light from the optical element installed in the optical MCM and guide it into the optical guides, are provided at each end of the optical guide on the printed circuit board. Accordingly, the optical MCM needs to be positioned in a high precision when mounting the optical MCM on the printed circuit board. Such accurate positioning makes the conventional optical distribution system expensive and thus, deteriorates productivity thereof.

In addition, a complicated process is needed for not only forming the optical guide but also for installing the reflecting mirror in the printed circuit board and accordingly, a printed circuit board having a large area cannot be manufactured with sufficient accuracy.

Further, although some methods for cooling a MCM are proposed in the publications of unexamined patent application Nos. 1996-130292, 1998-321775, 2002-270743, and 2002-343928, some of them are too complicated and others are insufficient to cool the MCM so that the MCM operates normally.

SUMMARY OF THE INVENTION

The present invention has been made in view of the above circumstances and provides a multi-chip module and a method for mounting thereof.

According to an aspect of the present invention, a multi-chip module having an optical element sending and receiving optical signals and mounted on a printed circuit board in which an optical guide is formed, includes an optical path-converting member that protrudes from a face of the multi-chip module that is to be connected to the printed circuit board, optically connected to the optical element, and inserted into an inserting hole formed on the printed circuit board so as to intersect the optical guide when mounting the multi-chip module. The optical path-converting member is inserted into the inserting hole to form an optical path guiding light from the optical element into the optical guide or guiding light transmitted through the optical guide into the optical element.

BRIEF DESCRIPTION OF THE DRAWINGS

Embodiments of the present invention will be described in detail based on the following figures, wherein.

DETAILED DESCRIPTION OF THE INVENTION

1. A First Embodiment

An example of the MCM of the present invention is described below.

Figure 1A:
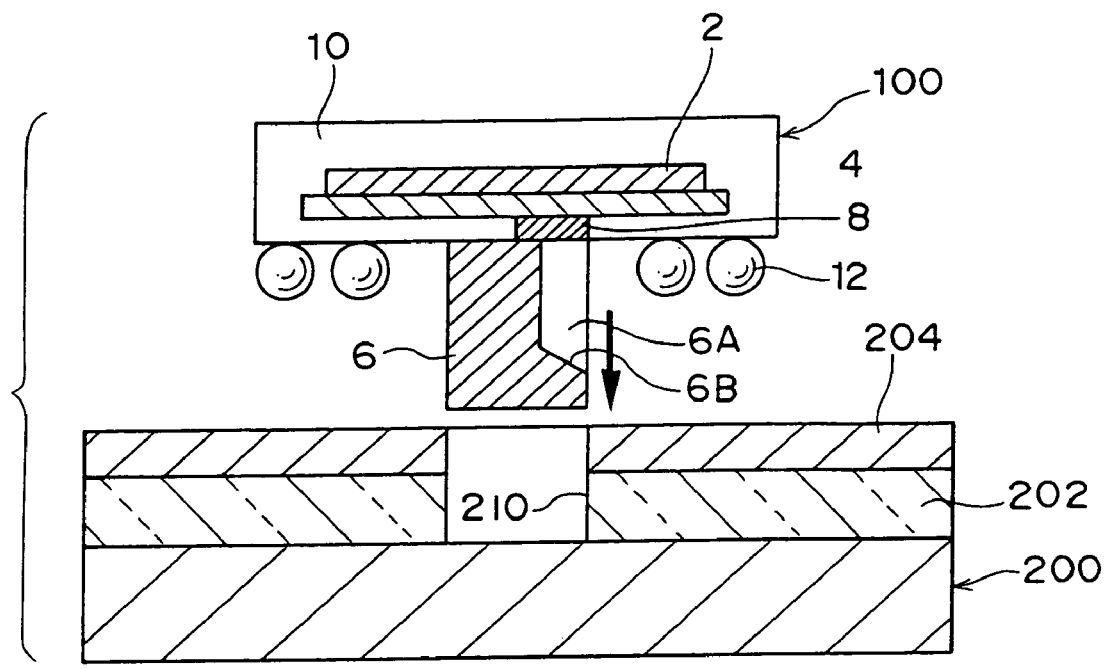
FIG. 1A is a brief sectional view showing a MCM of a first embodiment that is in the process of being attached on a printed circuit board.
Figure 1B:
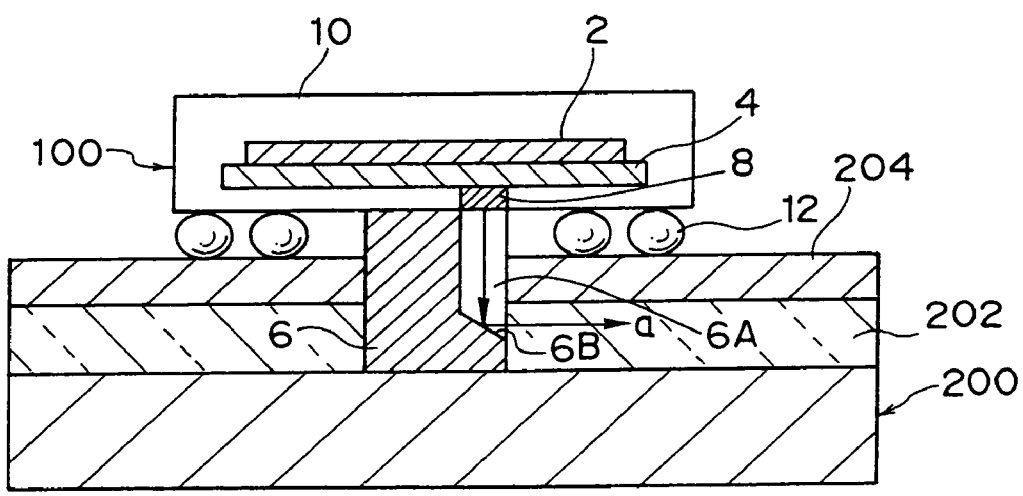
FIG. 1B is a brief sectional view showing the MCM of the first embodiment attached on the printed circuit board.

As shown in FIGS. 1A and 1B, a MCM 100 related to a first embodiment includes a chip 4, chip 2 layered above the chip 4, light-emitting element 8 connected electrically to a lower side of the chip 4, and an optical path converting block 6. One end of the optical path converting block 6 is optically connected to the light-emitting element 8 and other end thereof is inserted into an inserting hole 210 formed in a printed circuit board 200. The light-emitting element 8 and the optical path-converting block 6 correspond to the optical element and the optical path-converting member of the present invention, respectively.

The chip 2, the chip 4, and the light-emitting element 8 are mounted in a package 10.

The printed circuit board 200 includes an optical guide 202 buried inside and an electric wiring 204 formed on a surface thereof. The inserting hole 210 is formed to a depth reaching the optical guide 202. The chip 4 in MCM 100 is electrically connected to the electric wiring 204 of the printed circuit board 200 through solder balls 12.

Figure 2A:
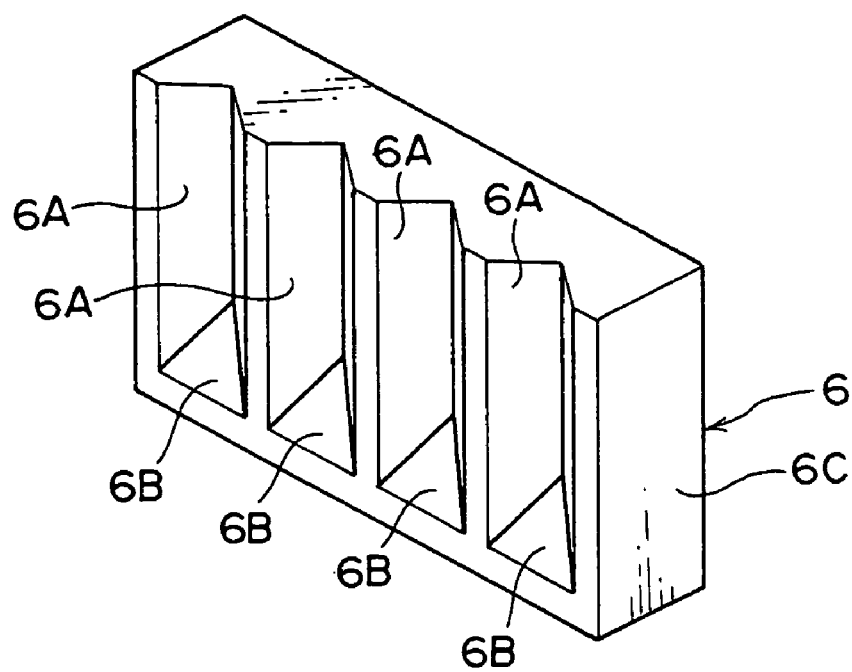
FIG. 2A shows a perspective view of an optical path-converting block that the MCM of the first embodiment includes.

As shown in FIG. 2A, the optical path-converting block 6 is a block 6C formed of light-reflecting material and having plural, for example 4, light-guiding grooves 6A that have a triangular section. A mirror 6B reflecting perpendicularly light guided along each light-guiding groove 6A is formed at one end of each light-guiding groove 6A.

Figure 2B:
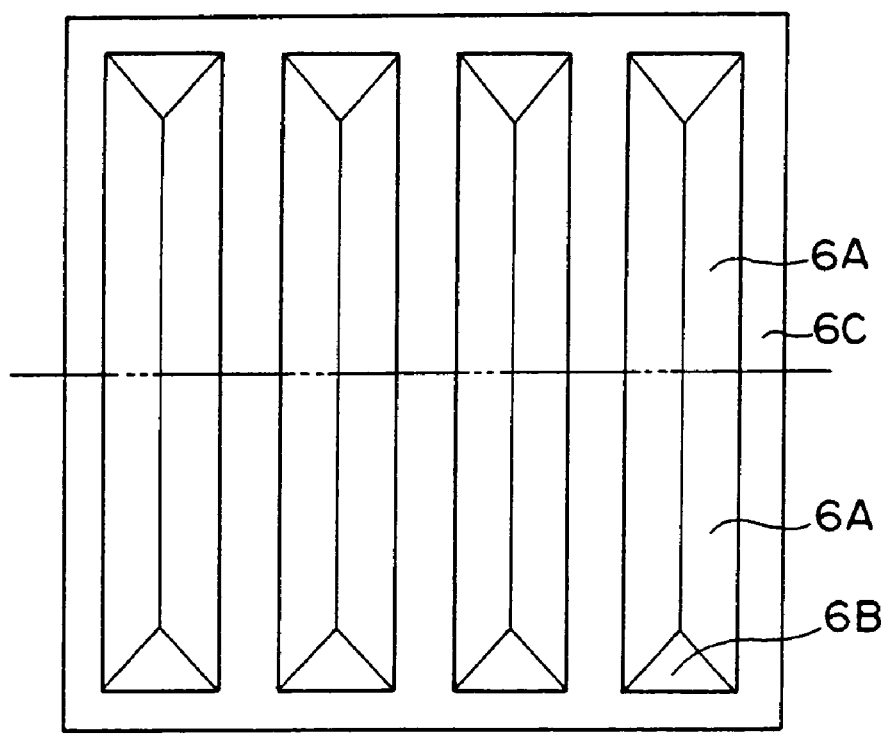
FIG. 2B shows a process for forming the optical path-converting block shown in FIG. 2A.

The optical path-converting block 6 can be formed by a process shown in FIG. 2B.

Firstly, a silicon substrate is anisotropically etched to form a specific number, for example 4, of light-guiding grooves 6A. Mirrors 6B are formed at both ends of each light-guiding groove 6A. A deposition process can be adopted for forming mirrors 6B with a high reflectivity. The material that can be used for forming the optical path-converting block 6 is not limited to silicon. A metal such as aluminum and stainless steel can be employed. The optical path-converting block 6 can be also formed of plastics and covered by metal deposition to form the light-guiding grooves 6A and mirrors 6B.

Then, as shown in the long dash, double dot line in FIG. 2B, the silicon substrate is cut into two blocks 6C in a direction perpendicular to the light-guiding grooves 6A to separate in two. The blocks 6C can be cut out one after another. However, the blocks 6C can be more efficiently cut out from the silicone substrate by using a dicing saw.

The light-guiding grooves 6A are filled with a transparent resin such as a poly-silane. The light-guiding grooves 6A are filled with the resin and then, the silicon substrate is cut into the block 6C to form one of end surfaces of the optical path-converting block 6.

As shown by FIGS. 1A and 1B, the optical path converting block 6 is attached on the lower surface of the MCM100 so as to be optically connected to the optical element 8 at the end surface thereof that is formed by cutting the silicone substrate into the block 6C. As shown by a thick arrow in FIG. 1A, the end of the optical path-converting block 6 at which mirrors 6B are formed is inserted into the inserting hole 210. After the optical path-converting block 6 is inserted into the inserting block 210, as shown by arrow 'a' in FIG. 1B, light emitted from the light-emitting element 8 passes through the light-guiding groove 6A, is reflected by the mirror 6B, and is introduced into the optical guide 202 in the printed circuit board 200.

Figure 3:
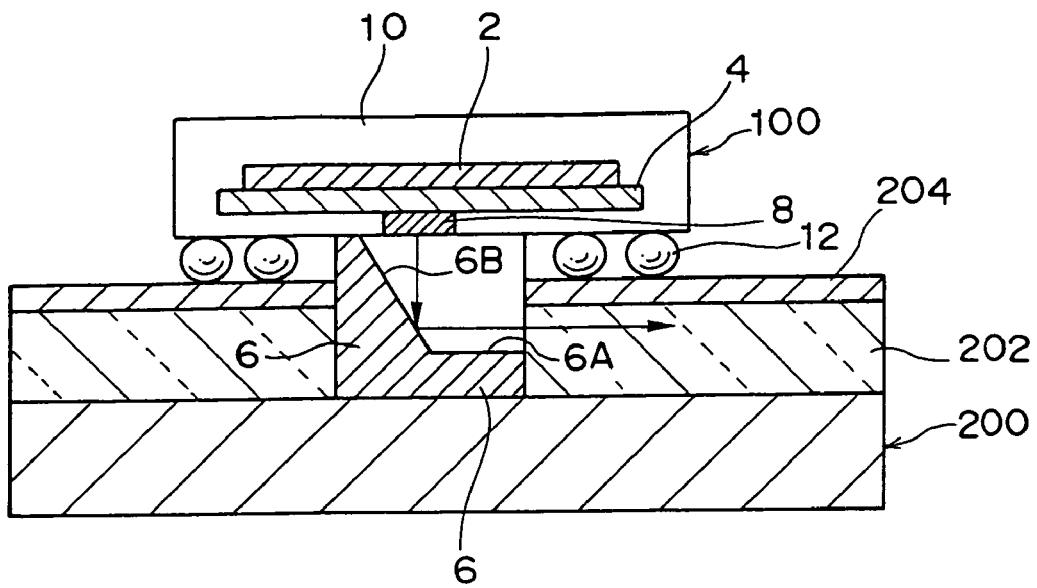
FIG. 3 is a brief sectional view showing a different example of the MCM of the first embodiment.

Additionally, as shown in FIG. 3, the optical path-converting block 6 can be set so that the surface thereof on which the light guiding grooves 6A are formed contacts with the lower surface of the MCM 100. By positioning the optical path-converting block 6 so that the light from the light-emitting element 8 firstly hits the mirror 6B, light from the light-emitting element 8 can be introduced into the light-guiding groove 202 of the printed circuit board 200.

Figure 4:
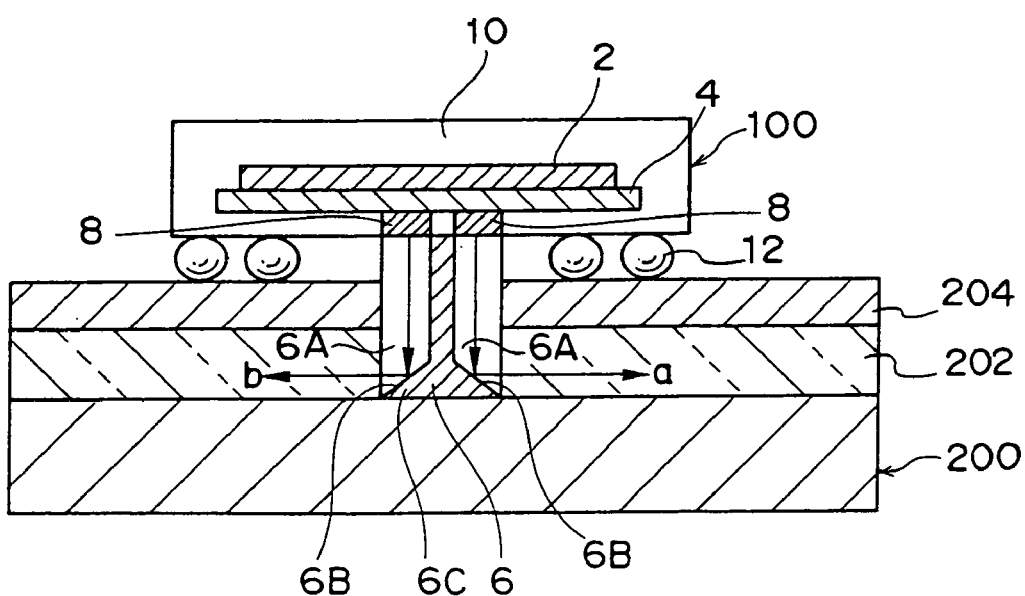
FIG. 4 is a brief sectional view showing a further different example of the MCM of the first embodiment.

Further, as shown in FIG. 4, an optical path-converting block 6 having the light-guiding grooves 6A and mirrors 6B formed on both sides of the block 6C can be employed. To introduce the light from the light-emitting element 8 into the optical guide 202 in two directions as shown in arrows 'a' and 'b'. In the MCM shown in FIG. 4, the light-emitting elements 8 are provided in two lines so that the light from the light-emitting elements 8 of each line is introduced into the light-guiding grooves 6A formed on each face of the optical path-converting block 6. The light-emitting elements 8 can be as well disposed in one line and the light from each light-emitting element 8 is introduced into the light-guiding grooves 6A on each side of the optical path-converting block 6.

2. A Second Embodiment

Another example of the MCM related to the present invention is mentioned below.

Figure 5A:
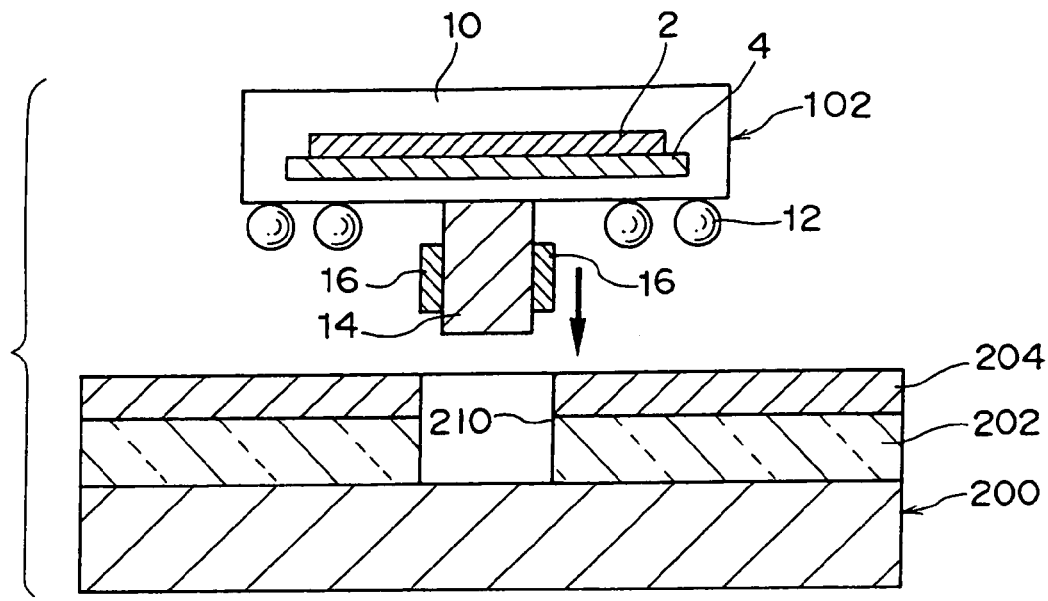
FIG. 5A is a brief sectional view showing a MCM of a second embodiment that is in the process of being attached on a printed circuit board.
Figure 5B:
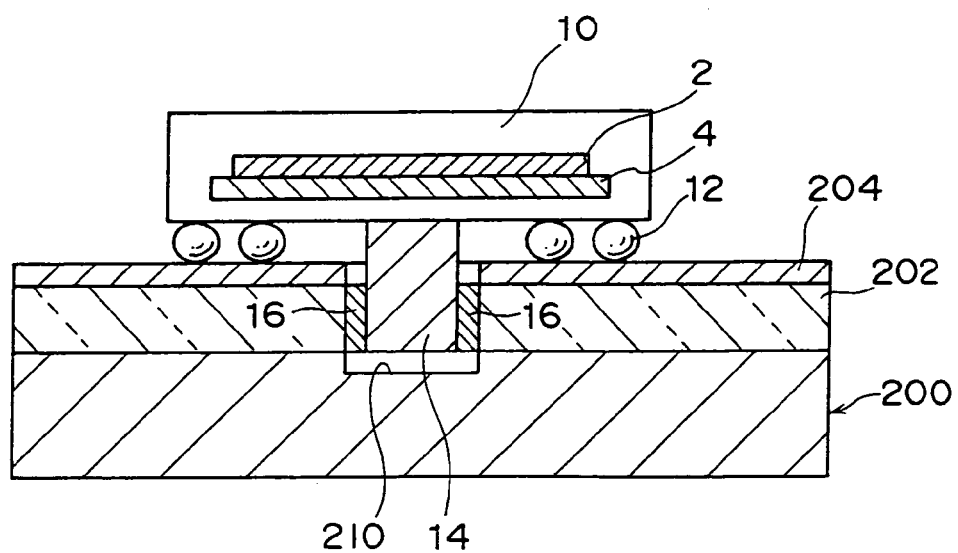
FIG. 5B is a brief sectional view showing the MCM attached on the printed circuit board.

FIG. 5A shows a MCM 102 of a second embodiment that is in the process of being attached to the printed circuit board 200 and FIG. 5B shows the MCM 102 attached to the printed circuit board 200. In FIGS. 5A and 5B, the reference numbers same as those in FIGS. 1A and 1B show the same element that is shown in FIGS. 1A and 1B.

As understood from FIGS. 5A and 5B, an inserting block 14 is erected at a central part of the lower face of the MCM 102. Optical elements 16 electrically connected with the chip 2 or the chip 4 are fixed closely to the end of the inserting block 14 on two opposite sides thereof.

As shown in FIG. 5B, when the MCM 102 is attached to the printed circuit board 200, the inserting block 14 is inserted into an inserting hole 210 and each optical element 16 faces each end-face of an optical guide 202 appearing inside of the inserting hole 210.

Therefore, signals emitted from the optical element 16 are transferred in the optical guide 202 and optical signals going through the optical guide 202 are received by the optical element 16.

Figure 6:
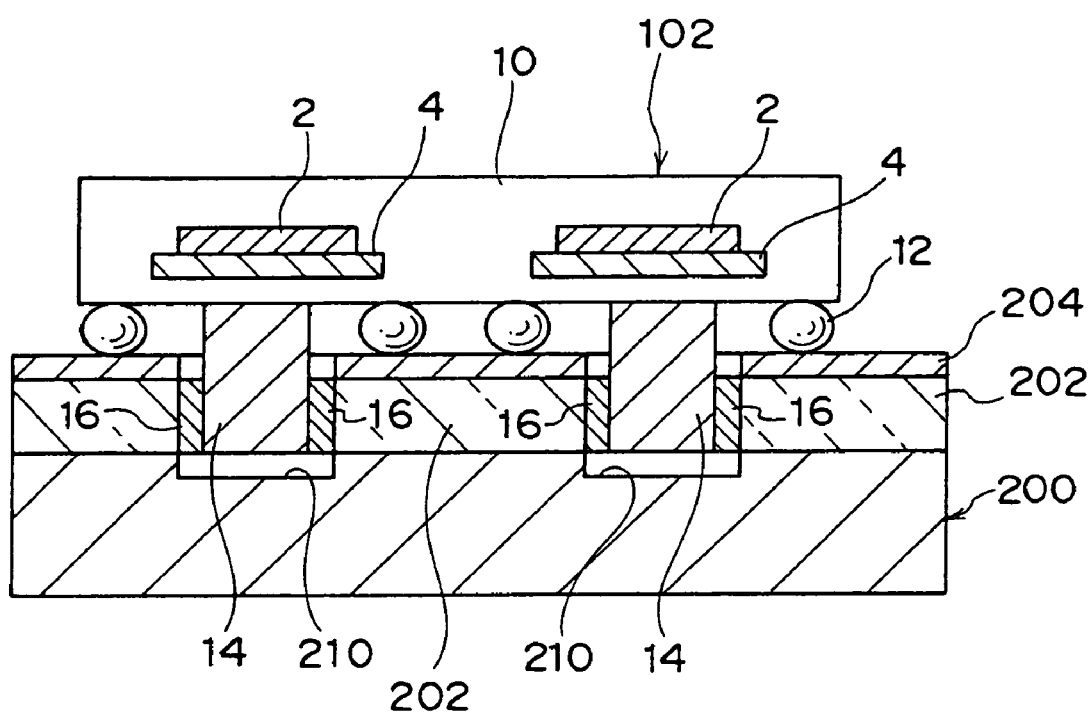
FIG. 6 is a brief sectional view showing a different example of the MCM of the second embodiment.

FIG. 6 show an example of the MCM 102 having plural inserting blocks 14 erected close to the periphery thereof. In the example shown in FIG. 6, the optical elements 16 are fixed on the tip of each inserting block 14. The optical element 16 is electrically connected with the chip 2 or the chip 4.

The printed circuit board 200 to which the MCM 102 shown in FIG. 6 is attached has plural inserting holes 210 formed for each of the inserting blocks 14. Thus, when attaching the MCM 102 to the printed circuit board 200, each inserting block 14 is inserted into the corresponding inserting hole 210 and optical signals are transferred from the optical element 16 to the light guide 202, and optical signals transferred through the optical guide 202 can be received by the optical element 16.

3. A Third Embodiment

Figure 7:
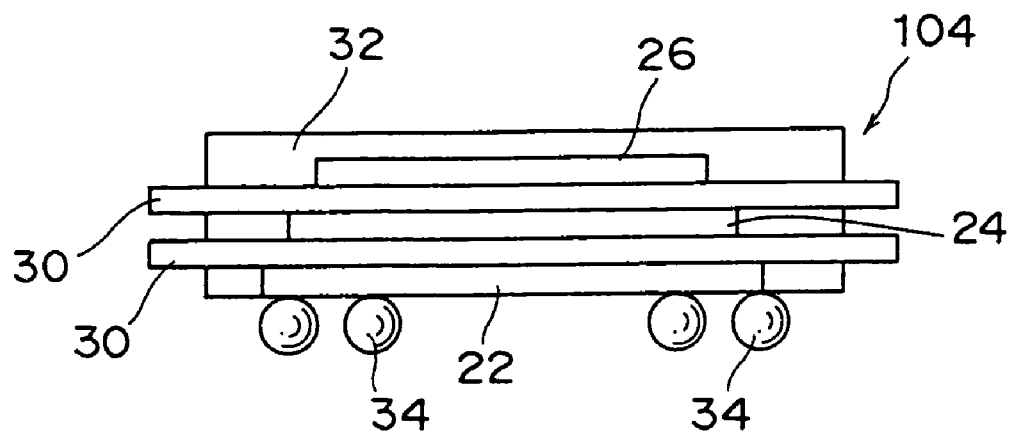
FIG. 7 is a brief sectional view showing a MCM of a third embodiment.

Further example of the MCM related to the present invention is shown in FIG. 7.

As shown in FIG. 7, a MCM 104 of the third embodiment includes a chip 22 in a lowest layer, chip 24 layered on the chip 22 and a chip 26 layered on the chip 24, and heat radiating plates 30 inserted between the chips 22 and 24 and the chips 24 and 26. The chips 22, 24, 26, and the heat-radiating plates 30 are covered by a package 32 to be protected from the atmosphere. Both ends of the heat-radiating plates 30 are protruded outside of the package 32. When the MCM 104 is attached to a printed circuit board (not shown in the figures attached hereto), the chip 22 is electrically connected to the printed circuit board by solder balls 34 and the chips 24 and 26 are electrically connected to the chip 22 by bonding wires 40 as shown FIGS. 9A to 9C.

The heat-radiating plates 30 can be formed of a metal having a high thermal conductivity such as aluminum, copper, or a copper alloy.

Figure 9A:
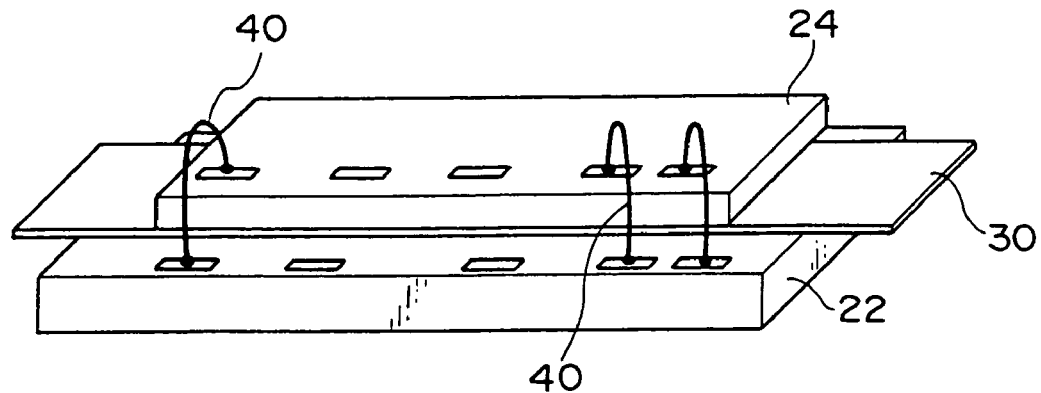
FIG. 9A is a perspective view showing an example of the MCM of the third embodiment wherein a heat-radiating plate thereof is a single plate or a sheet member.
Figure 9B:
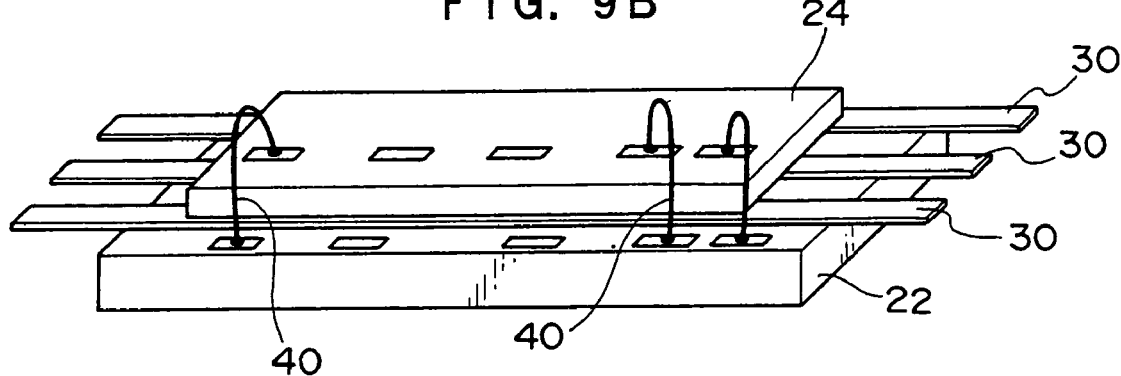
FIG. 9B is a perspective view showing an example of the MCM of the third embodiment wherein the heat radiating plate is strips disposed in parallel with each other.
Figure 9C:
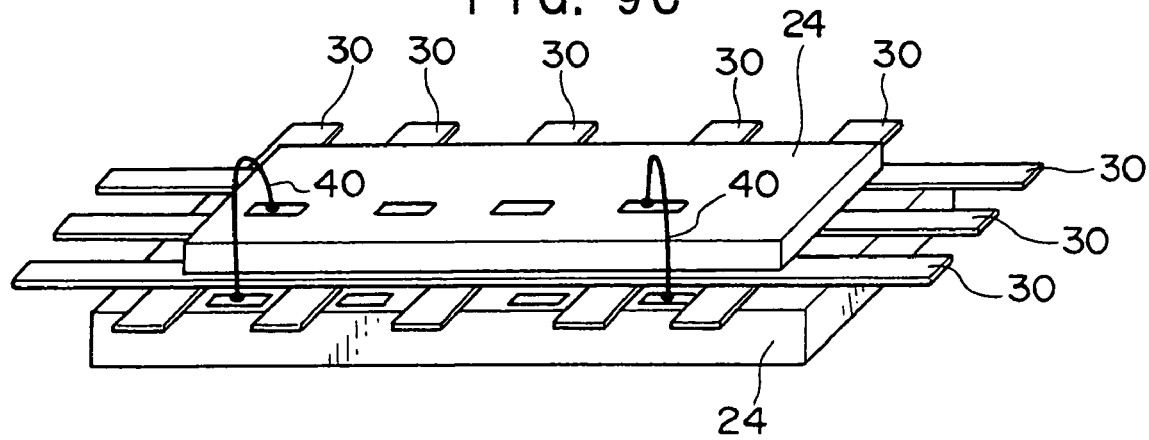
FIG. 9C is a perspective view showing an example of the MCM of the third embodiment wherein the heat radiating plate is strips disposed in a shape of a musical symbol 'sharp'.
Figure 10:
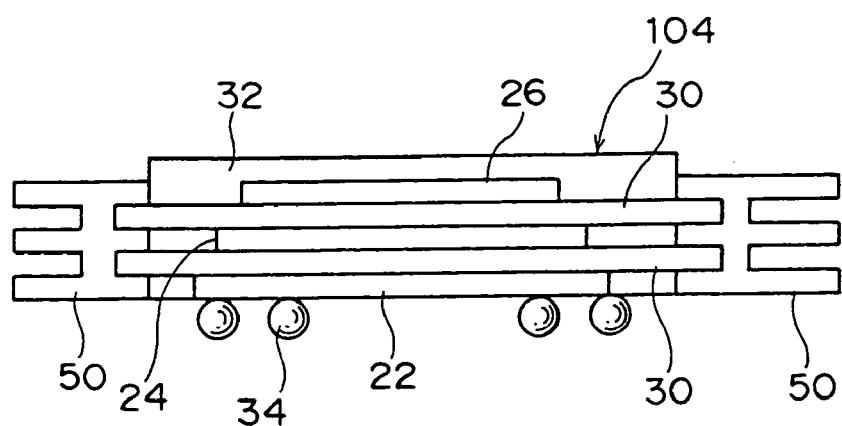
FIG. 10 is a brief sectional view showing an example of the MCM of the third aspect wherein a heat sink is attached to the heat-radiating plate.

As shown in FIG. 9A, the heat-radiating plates 30 can be a one piece plate or sheet member, or as shown in FIGS. 9B and 9C, can be strips that are long and narrow pieces.

When the strips are used as the heat-radiating plates 30, as shown in FIG. 9B, the strips can be arranged in parallel with each other or as shown in FIG. 9C, can be arranged in a shape of a music note 'sharp'.

Though the MCM 104 generates much heat since chips 24 and 26 are layered on the chip 22, heat-radiating plates 30 removes efficiently the heat generated at each chip since the heat-radiating plates 30 are inserted between the chips 22 and 24 and between the chips 24 and 26 with each end thereof protruding outside the package.

Accordingly, heat generated at each chip would not be accumulated in the MCM 104.

Figure 8:
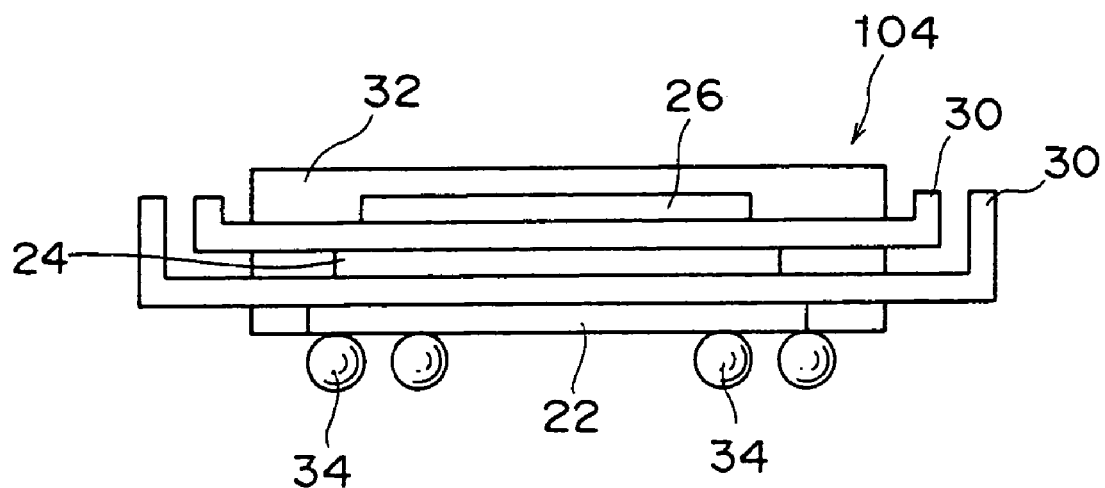
FIG. 8 is a brief sectional view showing a different example of the MCM of the third embodiment.

Additionally, as shown in FIG. 8, each end of the heat-radiating plates 30 can be bent in a direction towards a side opposite to the side of the MCM 104 that is to be attached to.

Further, when the MCM 104 generates extremely huge amount of heat, each end of the heat-radiating plates 30 can be contacted to a heat sink 50.

Figure 11:
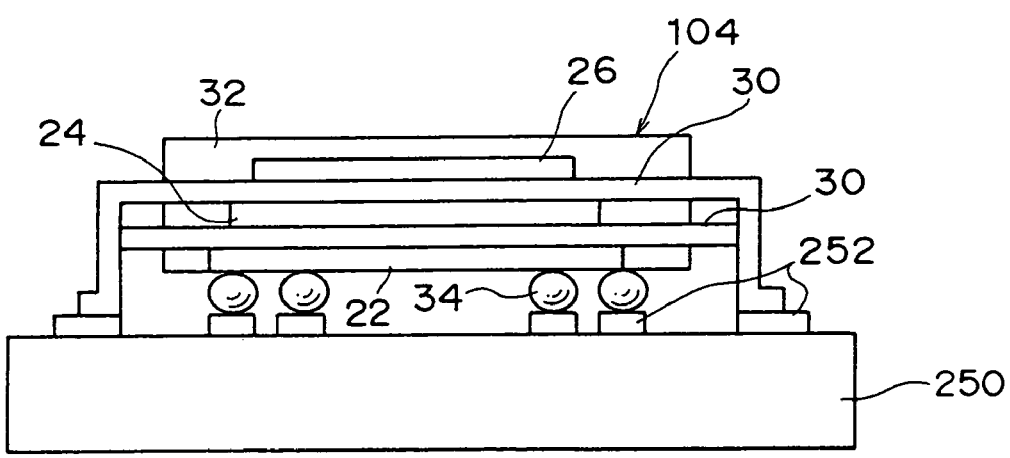
FIG. 11 is a brief sectional view showing an example of the third embodiment, wherein the heat-radiating plates are also employed as a wiring member.

In addition, as shown in FIG. 11, when the MCM 104 is attached onto a printed circuit board 250, the chips 22, 24, and 26 can be connected with electric wirings 252.

As described above, according to an aspect of the present invention, a multi-chip module having an optical element sending and receiving optical signals and mounted on a printed circuit board in which an optical guide is formed, including an optical path-converting member that protrudes from a face of the multi-chip module that is to be connected to the printed circuit board, is optically connected to the optical element, and is inserted into an inserting hole formed on the printed circuit board so as to intersect the optical guide when mounting the multi-chip module. The optical path-converting member is inserted into the inserting hole to form an optical path guiding light from the optical element into the optical guide or guiding light transmitted through the optical guide into the optical element.

In the above MCM, when mounting the MCM on the printed circuit board, by inserting the optical path-converting member into the inserting hole formed on the printed circuit board, an optical path connecting the optical element of the MCM and the optical guide formed in the printed circuit board is automatically formed.

Therefore, the MCM can be easily positioned when mounting and thus, the MCM is suitable for automatic mounting.

The MCM of the present invention includes a second aspect wherein the optical path-converting member is an optical path-converting block formed of a light-reflecting material and having one or more optical paths formed on at least one face thereof. The optical path has a light-guiding groove guiding light from the optical element and a mirror formed at one end thereof.

When the above MCM is attached on a printed circuit board, light radiated from the optical element of the MCM is guided into the light-guiding groove of the optical path-converting block and lead into an optical guide of the printed circuit board after being reflected by a wall of the light-guiding groove.

The optical path-converting block can be produced more cheaply than an optical path-converting device guiding light by optical fiber.

The optical path-converting block may have light-guiding groove having a v-shaped section and an angle formed by the mirror and the light-guiding groove is preferably 45 degrees since by the light-guiding groove, light can be effectively sent and received between the optical element and the optical guide.

Additionally, the optical path-converting block may be formed of silicon since a conventional IC or LSI manufacturing process can be employed for manufacturing the optical path-converting block.

Further, the light-guiding groove of the optical path-converting block may be filled with a material such as a poly-silane that is used for forming an optical guide. In addition, the material may form a core-clad structure wherein a core and a clad have a different optical reflectivity since by such a structure, light leakage from the light-guiding groove can be almost completely prevented.

The MCM of the present invention also includes a third aspect that is the second aspect of the present invention wherein the optical-path-converting block is a block that is formed of light-reflecting material and has the optical paths on two or more faces thereof.

The above MCM can send or receive plural signals from different sources at one time, or receiving optical signals from a source while sending out optical signals to different sources.

According to another aspect of the present invention, multi-chip module having an optical element sending and receiving optical signals and mounted on a printed circuit board in which an optical guide is formed, includes an inserting block that is formed on a face of the multi-chip module that is to be connected to the printed circuit board and is inserted into an inserting hole on the printed circuit board so as to intersect the optical guide when mounting the multi-chip module. The optical element is disposed on a side face of the inserting block so as to face an end face of the optical guide in the inserting hole when the MCM is mounted.

In the above MCM, the optical element of the MCM is automatically connected to the optical guide formed on the printed circuit board only by inserting the inserting block into the inserting hole formed on the printed circuit board. Thus, the MCM can be easily located when mounting on the printed circuit board.

Further, light is sent and received directly between the optical element of the MCM and the optical guide of the printed circuit board and thus, the light can be sent and received more efficiently.

In addition, the present invention also includes a MCM wherein plural chips are layered, the MCM has a heat-radiating plate that is sandwiched between the chips and protrudes outside of the MCM.

In the above MCM, heat generated in the chips is conducted to the heat-radiating plate and radiated from the end thereof into the outside and thus, the heat is removed efficiently.

By cooling a portion protruding outside the MCM, heat generated in a MCM can be effectively removed even when the MCM has a high degree of integration and generates much heat.

The chips and the central part of the heat-radiating plate may be accommodated in a package and both ends of the heat-radiating plate may be protruded from the package since the chips are protected from the outside environment and the heat generated at each chip is not accumulated in the package.

An MCM wherein both ends of the heat-radiating plate of the MCM are bent in a fin-like shape toward an opposite direction to the side mounted on a printed circuit board may be provided as a MCM for high integrity mounting since the MCM has a larger area of the heat-radiating plate for a smaller mounting area and heat generated in the MCM can be more effectively removed.

Further, even when the MCM generates too much heat to remove through the heat-radiating plate, by attaching a tip of the heat-radiating plate to a heat sink, the MCM can be cooled so as to be operated stably.

Additionally, the heat-radiating plate may be disposed so that the chips composing the MCM are connected to the electric wiring of the printed circuit board when the MCM is mounted on the printed circuit board since the heat-radiating plate works not only as a heat-radiating member but an electric wiring member and the electric wiring of the MCM can be drastically simplified.

The heat-radiating plate can be a one-piece plate as well as plural strips. The strips may be disposed between chips of two adjacent layers at regular intervals or disposed in a sharp note shape since heat generated in the MCM is conducted to both ends of the strips in a short time and therefore, the MCM has a high cooling efficiency. Especially, an MCM having strip-like heat-radiating plates thereof disposed in a shape of a musical note of sharp has a high cooling efficiency.

According to further aspect of the present invention, a method is provided for mounting a multi-chip module including an optical element sending and receiving optical signals on a printed circuit board having an optical guide formed therein. The method includes a step of forming an inserting hole on the printed circuit board so as to intersect the optical guide, and a step of connecting one end of an optical path-converting member to the optical element of the MCM and inserting other end thereof to the inserting hole formed on the printed circuit board so as to form an optical path guiding light from the optical element into the optical guide or guiding light transmitted in the optical guide to the optical element.

As described above, the optical element of the MCM is connected automatically with the optical guide formed in the printed circuit board only by inserting the optical path-converting member into the inserting hole formed on the printed circuit board. Thus, the MCM is easily positioned on the printed circuit board when mounting the MCM.

The foregoing description of the embodiment of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and there equivalents.

What is claimed is:

1. A multi-chip module that comprises an optical element sending and receiving optical signals and is mounted on a printed circuit board in which an optical guide is formed, the multi-chip module comprising:
   an optical path-converting member that protrudes from a face of the multi-chip module that is to be inserted into an inserting hole formed on the printed circuit board so as to intersect the optical guide when mounting the multi-chip module;
   a chip which is electrically connected to an upper side of the optical element,
   wherein the optical element is partially in direct contact with an upper surface of the optical path-converting member,
   the optical path-converting member being inserted into the inserting hole to form an optical path guiding light from the optical element into the optical guide or guiding light transmitted through the optical guide into the optical element,
   wherein the optical path-converting member is an optical path-converting block formed of a light-reflecting material and having one or more optical paths at least one face thereof, the optical path being formed by providing a V-shaped light-guiding groove on at least one of a plurality of lateral surfaces of the optical path-converting block, the light-guiding groove guiding light from the optical element and a mirror formed at one end thereof.

2. The multi-chip module of claim 1, wherein the optical path-convening block has light-guiding grooves on two or more lateral surfaces of the optical path-converting block.

3. The multi-chip module of claim 1, wherein the light-guiding groove is filled with air.

4. The multi-chip module of claim 1, wherein the light-guiding groove is filled with dielectric material.

5. The multi-chip module of claim 1, wherein the horizontal cross-section of the light-guiding groove has a triangular shape and the vertical cross-section of the light-guiding groove has a rectangular shape.

6. A method for mounting a multi-chip module that comprises an optical element sending and receiving optical signals on a printed circuit board having an optical guide formed thereon comprising:
   forming an inserting hole on the printed circuit board so as to intersect the optical guide;
   forming a chip that is electrically connected to an upper side of the optical element;
   connecting one end of an optical path-converting member to be partially in direct contact with the optical element of the multi-chip module and inserting the other end thereof to the inserting hole formed on the printed circuit board to form an optical path guiding light from the optical element into the optical guide or guiding light transihitted in the optical guide to the optical element; and forming a V-shaped light-guiding groove on at least one of a plurality of lateral surfaces of the optical path-converting member.

7. The method of claim 6, further comprising filling the light-guiding groove with air.

8. The method of claim 6, further comprising filling the light-guiding groove with dielectric material.

9. The method of claim 6, further comprising forming light-guiding grooves on two or more lateral surfaces of the optical path-converting member.

10. The method of claim 6, wherein the horizontal cross-section of the light-guiding groove has a triangular shape and the vertical cross-section of the light-guiding groove has a rectangular shape.

11. The method of claim 6, further comprising forming a mirror on at least one of a plurality of lateral surfaces of the optical path-converting member.

12. The method of claim 11, wherein the mirror has a triangular shape.

* * * * *